US005274203A

United States Patent [19]

Skalski et al.

[11] Patent Number: 5,274,203

[45] Date of Patent: Dec. 28, 1993

[54] "SMART" POSITION TRANSDUCER SYSTEM FOR ELEVATORS

[75] Inventors: Clement A. Skalski, Avon; Richard C. McCarthy, Simsbury, both of Conn.

[73] Assignee: Otis Elevator Company, Farmington, Conn.

[21] Appl. No.: 27,931

[22] Filed: Mar. 8, 1993

Related U.S. Application Data

[63] Continuation of Ser. No. 752,170, Aug. 23, 1991, abandoned, which is a continuation of Ser. No. 375,104, Jun. 30, 1989, abandoned.

[51] Int. Cl.[5] .......................... B66B 5/04; B66B 3/02; H03M 1/24

[52] U.S. Cl. .................................... 187/134; 187/140; 341/2

[58] Field of Search .................... 187/116, 140; 341/2, 341/9

[56] References Cited

U.S. PATENT DOCUMENTS

| | | | |
|---|---|---|---|
| 3,982,106 | 9/1976 | Stutz | 341/3 |
| 4,041,483 | 8/1977 | Groff | 341/2 |
| 4,161,235 | 7/1979 | Caputo et al. | 187/29 R |
| 4,384,275 | 5/1983 | Masel et al. | 341/2 |
| 4,411,577 | 10/1983 | Shearer, Jr. | 414/274 |
| 4,627,518 | 12/1986 | Meguerdichian et al. | 187/134 |
| 4,914,437 | 3/1990 | Kibrick et al. | 341/3 |

FOREIGN PATENT DOCUMENTS

| | | |
|---|---|---|
| 3243956A1 | 5/1984 | Fed. Rep. of Germany . |
| 2608756 | 12/1986 | France . |
| 2005843A | 4/1979 | United Kingdom . |
| 2165966A | 4/1986 | United Kingdom . |

OTHER PUBLICATIONS

Article entitled "Electronic Controls Cut Elevator Travel Time and Operating Cost", from *Machine Design*, vol. 53(1981) Apr., No. 8, Cleveland, Ohio, USA pp. 204, 205.

*Primary Examiner*—Steven L. Stephan
*Assistant Examiner*—Robert E. Nappi

[57] ABSTRACT

An elevator system (FIG. 1) employing a microprocessor-based group controller (FIG. 2 ) communicating with the cars (3, 4) using car position and velocity information provided by a "smart" primary position transducer (SPPT) system to control the motion of the cars and assign them to handle passenger demands. The SPPT includes an input shaft coupled to a primary encoder disk. Coupled to the shaft through gearing are one or more encoder disks (FIG. 7 ) performing the function of turns counting, as well as additional functions. Each disk contains multiple tracks, and each of these tracks is sensed by a sensor, or, alternatively, the SPPT may use two independent sensors per track. It is important to have two essentially independent means of performing the key sensing functions. The read heads of the SPPT are divided into primary and secondary sets with each set used to feed an independent processor. Within each set of sensor signals, cross checks are performed to insure the integrity of the system, which would detect a cracked or broken glass disk. In the electronics of the SPPT (FIG. 6 ) system primary and secondary position signals are each found by two methods and compared to maximize the likelihood of correct position determination, with one method given priority over the other, depending on the circumstances. Two independent channels for position and velocity information are maintained, using independent parts, except for the input shafts and encoder disks. Exemplary formulae for determining and generating the desired primary and secondary position and velocity information are provided.

6 Claims, 6 Drawing Sheets

"SMART" POSITION TRANSDUCER SYSTEM FOR ELEVATORS

This is a continuation of copending application(s) Ser. No. 07/752,170 filed on Aug. 23, 1991, now abandoned, which is a continuation of co-pending application Ser. No. 07/375,104 filed on Jun. 30, 1989, now abandoned.

TECHNICAL FIELD

The present invention relates to elevator systems and to encoding and locating the position of the elevator cars in an elevator system. More particularly the invention relates to a primary position transducer system for determining the location of an elevator car in an elevator system.

BACKGROUND ART

In an elevator system, one or more cars travel up and down the length of the elevator run, moving between the floors of the building carrying passengers.

In order to, inter alia, stop smoothly and level with the landing at each floor, it is important to know the precise location of the car at all times. To provide this information to the elevator controller system, a digital readout device known as a Primary Position Transducer or "PPT" is used.

For mid- and low-rise installations, a reader device mounted on the car and a vertical steel tape that runs the length of the hoistway are used to establish the car's position. Either steel vanes and/or magnets are mounted on the tape at precise locations with respect to the floor level of each landing.

For an example of a prior art position transducer system used with an elevator system, note assignee's U.S. Pat. No. 4,384,275 entitled "High Resolution and Wide Range Shaft Position Transducer Systems" of Masel et al issued May 17, 1983, the disclosure of which is incorporated herein by reference. In the patent two rotary position transducers are coupled to each other and to the shaft being rotated. Both of the transducers include one or more coded disks having sensing indicia forming tracks thereon that rotate a plurality of times in response to the rotations of the shaft, one of the transducers rotating at a different speed than the other. Each transducer produces signals, which are individual to the respective transducer and are the same for each rotation of the respective transducer.

The Masel patent includes:

sensing means related to each track for sensing the indicia thereon to provide signals indicative of the rotation of the disk from a rotational reference position; and signal processing means interconnected to the sensing means responsive to the signals corresponding to the coded tracks for providing a binary signal representation of the angular position of the disk and responsive to the signals corresponding to the coded tracks to provide, as a function of the number of coded track indicia which have been senses indicated thereby, a binary signal representation of the number of revolutions that the disk has rotated from the rotational reference position.

Some additional patents which may be of interest are U.S. Pat. No. 4,041,483 entitled "Absolute Incremental Hybrid Shaft Position Encoder" of Groff issued Aug. 9, 1977; and U.S. Pat. No. 3,885,209 entitled "Two Speed Control System" of Lazarus issued May 20, 1975. In the latter patent first and second transducers are connected to first and second rotatable shafts, respectively, with the shafts coupled to each other through a single mesh of gears. The transducers are electrically coupled in cascade to enable the first to provide a "fine" indication of the angular position of the first shaft, while the second provides a "coarse" indication of the number of revolutions of the same first shaft.

DISCLOSURE OF INVENTION

The "smart" primary position transducer ("SPPT") system of the present invention is a subsystem of the car control system for each car for the overall elevator system.

The SPPT apparatus includes an input shaft coupled to a primary encoder disk. Coupled to the shaft through gearing are one or more encoder disks that perform the function of turns counting, as well as additional functions.

Each disk contains multiple tracks, and each of these tracks is sensed by a sensor. An alternate sensing means is the use of two or more independent sensors per track. An important aspect of the invention is to have two or more essentially independent means of performing the key sensing functions.

The read heads of the SPPT can be divided into a primary set and a secondary set. Each set of sensors is used to feed an independent processor. Within each set of sensor signals, cross checks are performed to insure the integrity of the system. For example, a cracked or broken glass disk could be detected As noted, an important aspect of the invention is for the sensors to be independent. Although multiple tracks on multiple disks are preferred, it is possible to use, for example, a single disk with a sufficient number of tracks, if multiple sensors are included with the single disk.

The sensible indicia are preferably in the form of optical tracks, although magnetic sensing or hole sensing, etc., could be used. Also, the principles of the invention can be realized in a multi-winding resolver system, etc., and, hence, the use of a disk, although preferable, is not mandatory to the invention.

In essence the present invention provides means for finding two or more independent position and velocity signals and derivatives of these signals with an instrument having a common input shaft. There are many possible embodiments to do this, including for example:

1. An incremental system using a single encoder disk and two or more read heads.
2. A quasi-absolute system using differential gearing that is capable of two independent position and speed signals.
3. An absolute system, including a main disk attached to said input shaft; additional absolute encoders coupled to the input shaft through gears determining the turns of the main shaft; and at least two independent position and velocity output signals being obtained with the use of independent sets of read heads located circumferentially about each disk, a primary output signal being used to run the elevator and the other, secondary, output signal being used for normal terminal protection for the elevator car travel. A combination of the primary and secondary velocity signals may be used to derive a door zone speed check signal in compliance with the ANSI A-17.1 Elevator Code, which requires that an independent means be used to check speed in the door zone. By equipping the system with a third set of sensors, it is possible to obtain an independent position signal useful for verifying that the elevator is in the door zone before the doors are opened.

By the use of additional sensor assemblies, a fourth independent set of position and velocity information could be generated for the purpose of meeting the emergency terminal stopping requirements of the A-17.1 code.

Each set of sensors needs to work with an independent processor system. In situations where a composite signal is produced from two processors, such as for the door speed check signal, it is essential to buffer the connections from the processors to the common circuitry, so that a failure in one processor cannot affect the operation of the other.

The basic concept followed in this new class of instruments is to provide independent signals when a common input shaft is used. One interpretation of independence is that a failure in one channel cannot affect any other channel. To guard against a disk fracture, etc., from affecting two or more channels, the "health" of each channel is monitored. Any severe malfunction on one channel will cause an emergency stop of the elevator. Also, the system receiving the primary and secondary signals will initiate an emergency stop if excessive disagreement exists between the primary and secondary channels.

Thus, the primary and secondary position channels are made independent of one another in the SPPT of the present invention. The sensor devices, such as phototransistors or coils, used for the primary and secondary position determinations are made independent of each other. With the approach(es) of the present invention a failure in one of the sensor devices will not cause a failure in any other sensor device.

The "health" of the disks used for quasi-absolute encoding are checked by checking the symmetry of the coarse tracks.

Absolutely encoded disks are usually encoded using the "Gray" code, and errors can be detected if more than a single bit changes at one time. Also, in absolutely encoded systems the turns counting encoders can be used for safety checking.

In the preferred embodiment the "smart" primary position transducer system is driven by, for example, a steel selector tape attached to the elevator car, using a quasi-absolute transducing system preferably with battery backup. In each transducer, primary and secondary position signals preferably are each found by two methods and compared to maximize the likelihood of correct position determination.

The "smart" aspects of the PPT additionally use two independent channels for position and velocity information for the car with which it is associated.

The SPPT includes preferably two encoders coupled by, for example, "256:257" gearing. The encoders preferably are of identical design, and in the preferred embodiment contain two fine (1024 ppr) tracks, and two coarse (1 ppr) tracks. Each pair of tracks produce signals that are in quadrature with each other.

The directly-driven encoder is termed the "primary encoder" and is connected directly to an appropriately toothed gear, for example, a two hundred and fifty-six (256) tooth gear. The other encoder is termed the "secondary encoder" and is connected to the primary encoder by means of a different toothed gear, for example, a two hundred and fifty-seven (257) tooth gear. The difference in the number of teeth in the gears used for the otherwise identical two transducers produces a non-1:1 ratio, namely in the preceding example, a 257/256 ratio of secondary to primary.

The main and quadrature fine track signals are processed by external circuitry, well known to those of ordinary skill in the art. This processing results in a "×4" (four times) frequency multiplication, and a determination of the direction of rotation.

The exemplary encoder disks used with the transducer have a range of a large number of revolutions, such as an exemplary two hundred and fifty six (256) revolutions with, for example, twelve (12) bit per revolution encoding on the primary channel and, for example, at least eight (8) bit per revolution on the secondary channel.

The two channels preferably use independent parts except, for example, the input shaft and encoder disks. This leads to very high reliability and a very low probability of any undetected failures.

This two channel integrated elevator position/velocity transducer system provides economical performance of the following important elevator control functions:

normal position control;

normal terminal protection; and door zone protection.

Signals representing the position and velocity of the respective car may be determined and generated in the following manner.

The determination of position for the primary channel requires the finding of coarse position and then adding incrementally derived fine positions to it. Further, for reasons of elevator safety, a redundant secondary position is desired. This is accomplished using hardware that is independent of that used for the primary position.

Primary position as a HEX number consists of:

PRI_POS=COARSE_PRI_POS*1000+FINE_PRI_POS where FINE_PRI_POS is derived from the XY counts and equals "000" at the end of each coarse primary position determination cycle; where the fine track of the primary encoder is "X", the quadrature track is "Y", and the times four ("×4") composite signal is called "XY".

Two basic techniques exist for determination of primary position (PRI_POS) and secondary position (SEC_POS), once the transducer system is initialized.

The first technique is to update a first primary coarse position register based upon the fine position determine by the XY composite signal. When FINE_PRI_POS=1000, the first primary coarse position register is incremented by one count and a first FINE_PRI_POS register is reset to be equal to "000". More generally, this is equivalent to FINE_PRI_POS is divided by "1000" and the result is added to COARSE_PRI_POS, and FINE_PRI_POS is reset to the remainder.

If FINE_PRI_POS goes negative, COARSE_PRI_POS should be decremented and FINE_PRI_POS reset accordingly. On an interim basis, the fine position should always be characterized by a magnitude and sign. When the reckoning for position is complete, then the fine position is always a positive number.

The second technique or method is to update a second primary coarse position register directly by measurement based on coarse track readings. To do this FINE_PRI_POS register is set equal to the appropriate value (e.g., 256) immediately after the completion of the update.

The absolute primary velocity (HEX) for a given cycle (N) is computed from the PRIMARY POSITION value of two preceding cycles. Thus:

ABS_PRI_VEL(N)=

$[PRI\_POS(N-1)-PRI\_POS(N-2)]*(1/1000)*(60/T)_{HEX}$ where T=cycle time, which is measured in decimal seconds.

The secondary position as a HEX number consists of:

SEC_POS=

$(COARSE\_SEC\_POS*1000+SEC\_FINE\_POS)*(101/100)_{HEX}$ where SEC_FINE_POS is derived from JK counts, and SEC_FINE_POS=000 at the end of each coarse secondary position determination cycle; where the fine track of the secondary encoder is "J", the quadrature track is "K" and the times four ("×4") composite signal is called "JK". The 101/100 (HEX) ratio accommodates the 257/256 ratio of the encoder.

The first method for determining SEC_POS is to update coarse position register based upon the fine position determined by the JK composite signal. When a first secondary SEC_FINE_POS=FFO, the first secondary coarse position register is incremented by one count and a first SEC_FINE_POS register is reset to "000". More generally, SEC_FINE_POS is divided by "FFO" and the result is added to COARSE_POS, and SEC_FINE_POS is reset to the remainder.

If SEC_FINE_POS goes negative, COARSE_SEC_POS should be decremented, and SEC_FINE_POS reset accordingly. On an interim basis, fine position should always be characterized by a magnitude and sign. When the reckoning for position is complete, then the fine position is always a positive number.

The second method is to update a second secondary coarse position register directly by measurement. A second SEC_FINE_POS register is set to be equal to an appropriate value immediately after completion of the update.

In like fashion for PRI_POS and SEC_POS, the first method should always be used. The second method should be used whenever there are no direction reversals during the measurement process (other than near or at floor landings). Likewise, for both PRI_POS and SEC_POS, appropriate "disagreement" rules (explained more fully below) are used to maintain the integrity of the data.

The absolute secondary velocity (HEX) is computed from the SECONDARY POSITION. Thus:

ABS_SEC_VEL(N)=

$[SEC\_POS(N-1)-SEC\_POS(N-2)]*(1/1000)*(60/T)_{HEX}$ where T=cycle time, which is measured in decimal seconds.

Polarity reversal is necessary as a practical matter to meet different transducer mounting situations. This may be accomplished by the following algorithms expressed in HEX (2's complement):

$PRI\_POS=100000-PRI_{13}\,POS$ $SEC\_POS=100000-SEC\_POS$

The primary velocity and the secondary velocity given above in the calculation subsection must be reversed when a polarity reversal is indicated. This can be done by changing the sign bit.

A speed check signal preferably is provided in association with the transducer system for door-zone safety check. The software used preferably stresses fault discovery and automatic recovery, and two independent serial links (e.g. RS-422 type) preferably are used to facilitate connection of the transducer system to the elevator controller system.

A discrete speed check signal is provided to indicate that the speed (the magnitude of velocity) is below a prescribed threshold called the speed check. This signal goes "high," whenever both the primary and secondary speeds are below the threshold speed. Otherwise, the signal is "low." It becomes active within, for example, one hundred (100 ms) milliseconds after power is applied to the transducer.

It is possible to set two check speeds in the range of, for example, eight to sixty-four (8–64 rpm) revolutions per minute in an EPROM variables in a given building. The factory setting for the threshold can be, for example, 27.38 rpm (which is 145 fpm with a 20.231" diameter sheave). By means of jumpers one can choose an alternate check speed of, for example, 17.94 rpm (95 fpm). The speed check signals should be accurate to within at least ±1.5 rpm and include, for example, a half (0.5) rpm of hysteresis.

With battery backup, position information is remembered for at least one hour (for example) after building power failure. The data is updated in memory preferably at least every ten (10 ms.) milliseconds (for example).

The primary advantages of the invention are its safety, reliability, exceptionally high resolution and accuracy, serviceability, and relatively moderate installed cost.

The invention may be practiced in a wide variety of elevator systems, utilizing known technology in the light of the teachings of the invention, which are discussed in detail hereafter.

Other features and advantages will be apparent from the specification and claims and from the accompanying drawings, which illustrate an exemplary embodiment of the invention.

BEST MODE FOR CARRYING OUT THE INVENTION

Exemplary Elevator Application

For the purposes of detailing an exemplary application of the present invention, the disclosure of assignee's U.S. Pat. No. 4,363,381 to Bittar is incorporated herein by reference.

The preferred application for the present invention is in an elevator control system employing a microprocessor-based group controller dispatcher using signal processing means, which communicates with the cars of the elevator system to determine the conditions of the cars, particularly their vertical positions in the building, and, for example, responds to hall calls registered at a plurality of landings in the building serviced by the cars under the control of the group controller.

Figure 1:
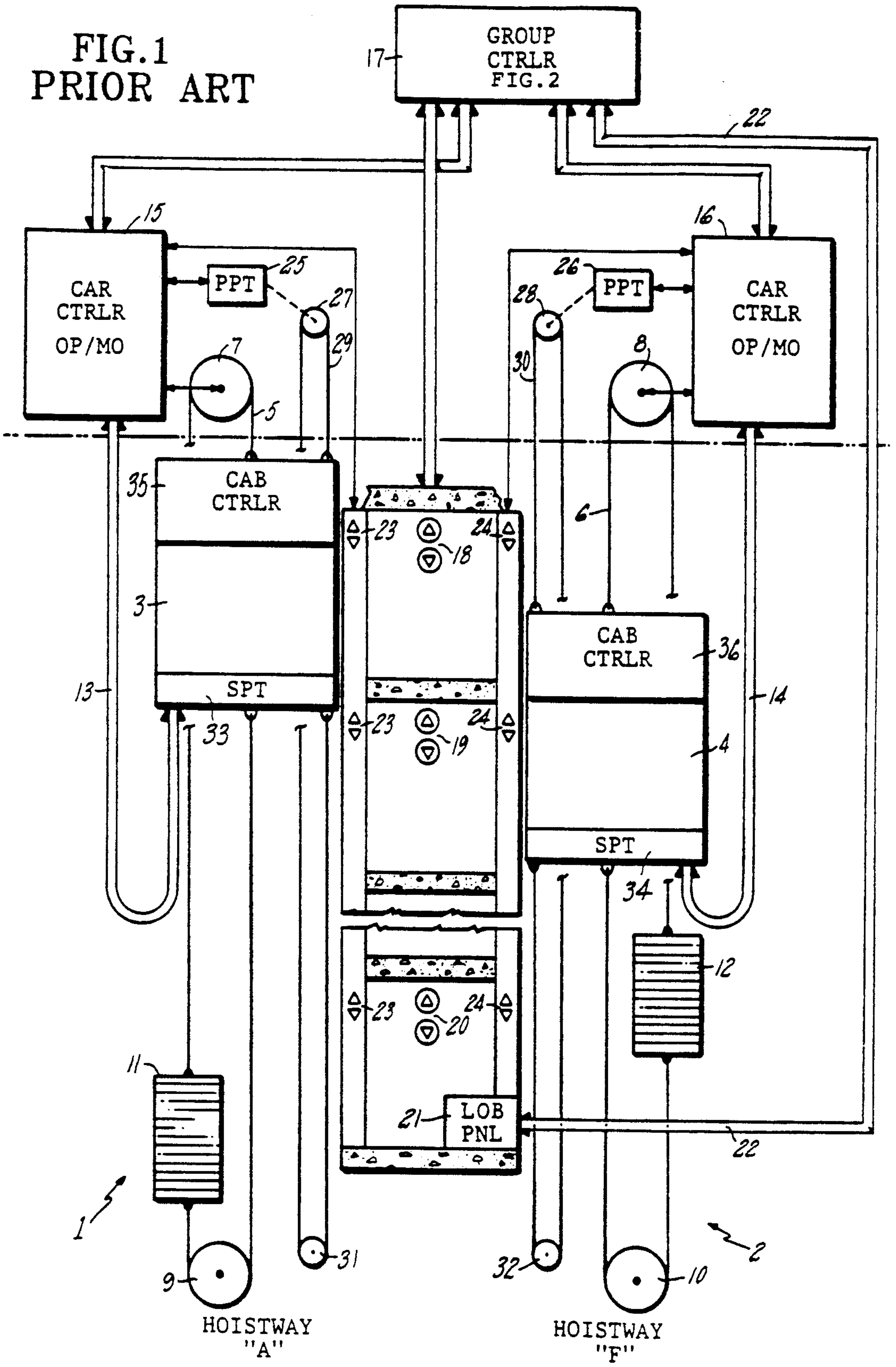
FIG. 1 PRIOR ART
FIG. 1 is a simplified diagram, partially broken away, of an exemplary known elevator system in which the exemplary embodiment of the smart position transducer system of the present invention (FIGS. 3+) may be incorporated.
Figure 2:
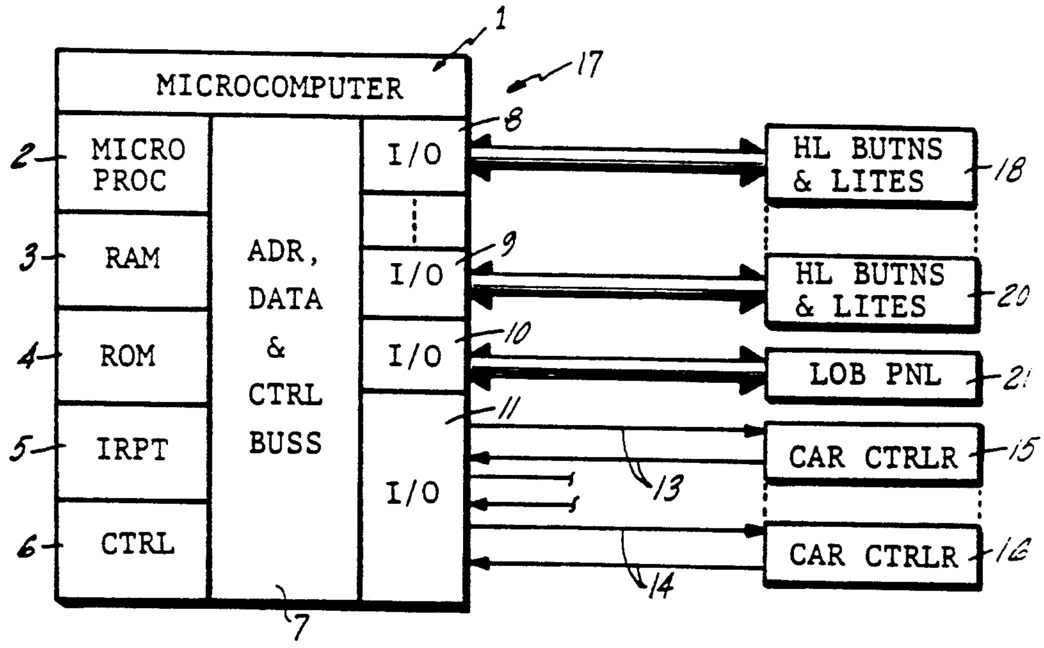
FIG. 2 PRIOR ART
FIG. 2 is a simplified, schematic block diagram of an exemplary known car controller, which may be employed in the system of FIG. 1, and in which the invention may be implemented.

It is noted that FIGS. 1 & 2 hereof are substantively identical to the same figures of the '381 patent. For the sake of brevity the elements of FIGS. 1 & 2 are merely outlined or generally described below while any further, desired operational detail can be obtained from the '381 patent, as well as other of assignee's prior patents.

In FIG. 1, a plurality of exemplary hoistways, HOISTWAY "A" 1 and HOISTWAY "F" 2 are illustrated, the remainder not being shown for simplicity purposes. In each hoistway, an elevator car or cab 3, 4 is guided for vertical movement on rails (not shown).

Each car is suspended on a steel cable 5, 6, that is driven in either direction or held in a fixed position by a drive sheave/motor/brake assembly 7, 8, and guided by an idler or return sheave 9, 10 in the well of the hoistway. The cable 5, 6 normally also carries a counterweight 11, 12, which is typically equal to approximately the weight of the cab when it is carrying half of its permissible load.

Each cab 3, 4 is connected by a traveling cable 13, 14 to a corresponding Car controller 15, 16, which is typically located in a machine room at the head of the hoistways. The car controllers 15, 16 provide operation and motion control to the cabs, as is known in the art.

In the case of multi-car elevator systems, it has long been common to provide a group controller 17, which receives up and down hall calls registered on hall call buttons 18-20 on the floors of the buildings and allocates those calls to the various cars for response, and distributes cars among the floors of the building, in accordance with any one of several various modes of group operation. Modes of group operation may be controlled in part, for example, by a lobby panel ("LOB PNL") 21, which is normally connected by suitable building wiring 22 to the group controller in multi-car elevator systems.

The car controllers 15, 16 also control certain hoistway functions, which relate to the corresponding car, such as the lighting of "up" and "down" response lanterns 23, 24, there being one such set of lanterns 23 assigned to each car 3, and similar sets of lanterns 24 for each other car 4, designating the hoistway door where service in response to a hall call will be provided for the respective up and down directions.

In the prior art the position of the car within the hoistway is derived from a primary position transducer ("PPT") 25, 26. Such a transducer is driven by a suitable sprocket 27, 28 in response to a steel tape 29, 30, which is connected at both of its ends to the cab and passes over an idler sprocket 31, 32 in the hoistway well.

Similarly, although not required in an elevator system to practice the present invention, a secondary position transducer ("SPT") 33, 34 may be employed for obtaining additional detailed positional information at each floor for more door control and for verification of floor position information derived by the "PPT" 25, 26. Or, if desired, the elevator system in which the present invention is practiced may employ inner door zone and outer door zone hoistway switches of the type known in the art.

All of the functions of the cab itself may be directed, or communicated with, by means of a cab controller 35, 36 in accordance with the present invention, and may provide serial, time-multiplexed communications with the car controller, as well as direct, hard-wired communications with the car controller by means of the traveling cables 13 & 14. The cab controller, for instance, can monitor the car call buttons, door open and door close buttons, and other buttons and switches within the car. It can also control the lighting of buttons to indicate car calls and provide control over the floor indicator inside the car, which designates the approaching floor.

The cab controller 35, 36 may interface with load weighing transducers to provide weight information used in controlling the motion, operation, and door functions of the car.

An additional function of the cab controller 35, 36 is to control the opening and closing of the door, in accordance with demands therefore, under conditions which are determined to be safe.

The makeup of microcomputer systems, such as may be used in the implementation of the car controllers 15, 16, a group controller 17, and the cab controllers 35, 36, can be selected from readily available components or families thereof, in accordance with known technology, as described, for example, in various commercial and technical publications. The software structures for implementing the present invention, and peripheral features which may be disclosed herein, may be organized in a wide variety of fashions.

Smart PPT of Invention

The foregoing is a description of an elevator system in general, and, as far as the description goes thus far, is equally descriptive of elevator systems known to the prior art, as well as an exemplary elevator system which could incorporate the teachings of the present invention.

The "smart" primary position transducer central processor unit (SPPT-CPU) used in the present invention is a subsystem of the overall modular control system for the elevator system. It is designed to perform a number of tasks related to the position and velocity of the elevator with which it is associated and the status of the SPPT system as well.

The major function of the SPPT-CPU is to transform the accumulated pulse train signals received from the encoders into position and velocity information. This information, along with speed check and battery status, are communicated to the motion control subsystem (MCSS-CPU) for the elevator upon request.

Figure 3:
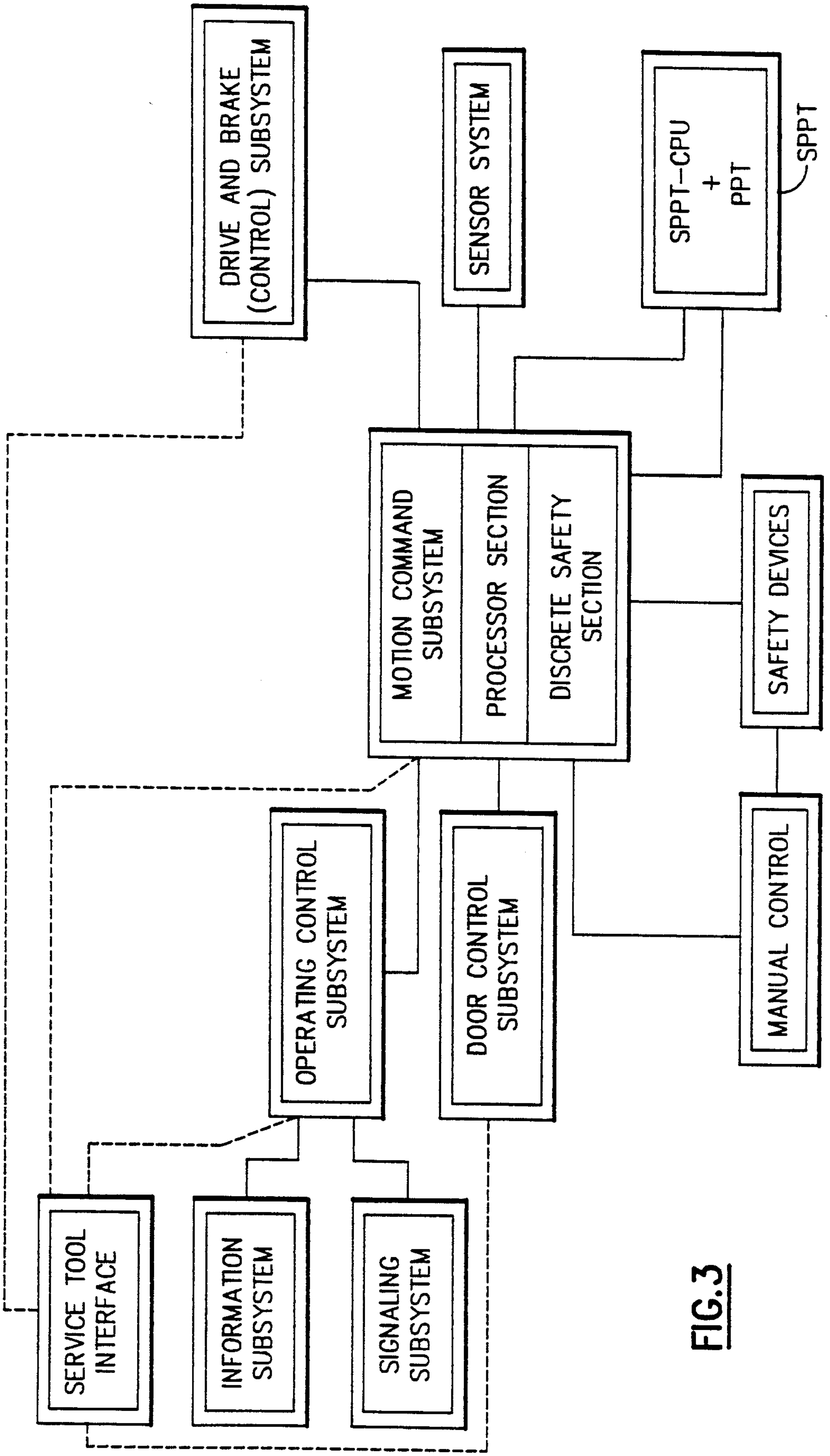
FIG. 3 is a simplified, block diagram showing the interfacing of the motion control subsystem (MCSS) for the elevator car with its various related subsystems, including the exemplary "smart" primary position transducer's central processing unit (SPPT-CPU) and the primary position transducer (PPT) of the present invention.

As can be seen in FIG. 3, the SPPT (which includes the encoder assembly or PPT) interfaces with the motion command subsystem (MCSS) and the power supply subsystem (PASS, not shown) of the MCSS. In essence the SPPT is made up of the SPPT's CPU and the encoder assembly or PPT.

The SPPT-CPU hardware is comprised of two identical circuits for the counting and storage of transducer inputs, configured into, for example, six basic elements. These exemplary basic elements include one circuit board assembly (CBA), one position transducer (PT), one position transducer housing, one battery backup, and two cable assemblies—one (W1, W2) for the encoder signal and the other (W3) for the power signal.

The exemplary CBA for the SPPT-CPU includes three connectors, two ten pin connectors (W1, W2) to the transducer encoder and a twenty-six pin connector (W3) to the MCSS-CPU and its power supply and backup battery. Through the latter connector (W3) the CBA interfaces with the primary position transducer (J2), the secondary position transducer (J1), the power supply and the battery backup (J3).

The J2 connector (PPT) receives the pulse train used to determine the position and direction of the travel of the elevator car. The secondary PT is mainly a backup system (through J1) to provide slowdown, if the PPT signals are lost when approaching either terminal landing.

All position and velocity signals can be in the form of "RS-422" serial communication.

Figure 5:
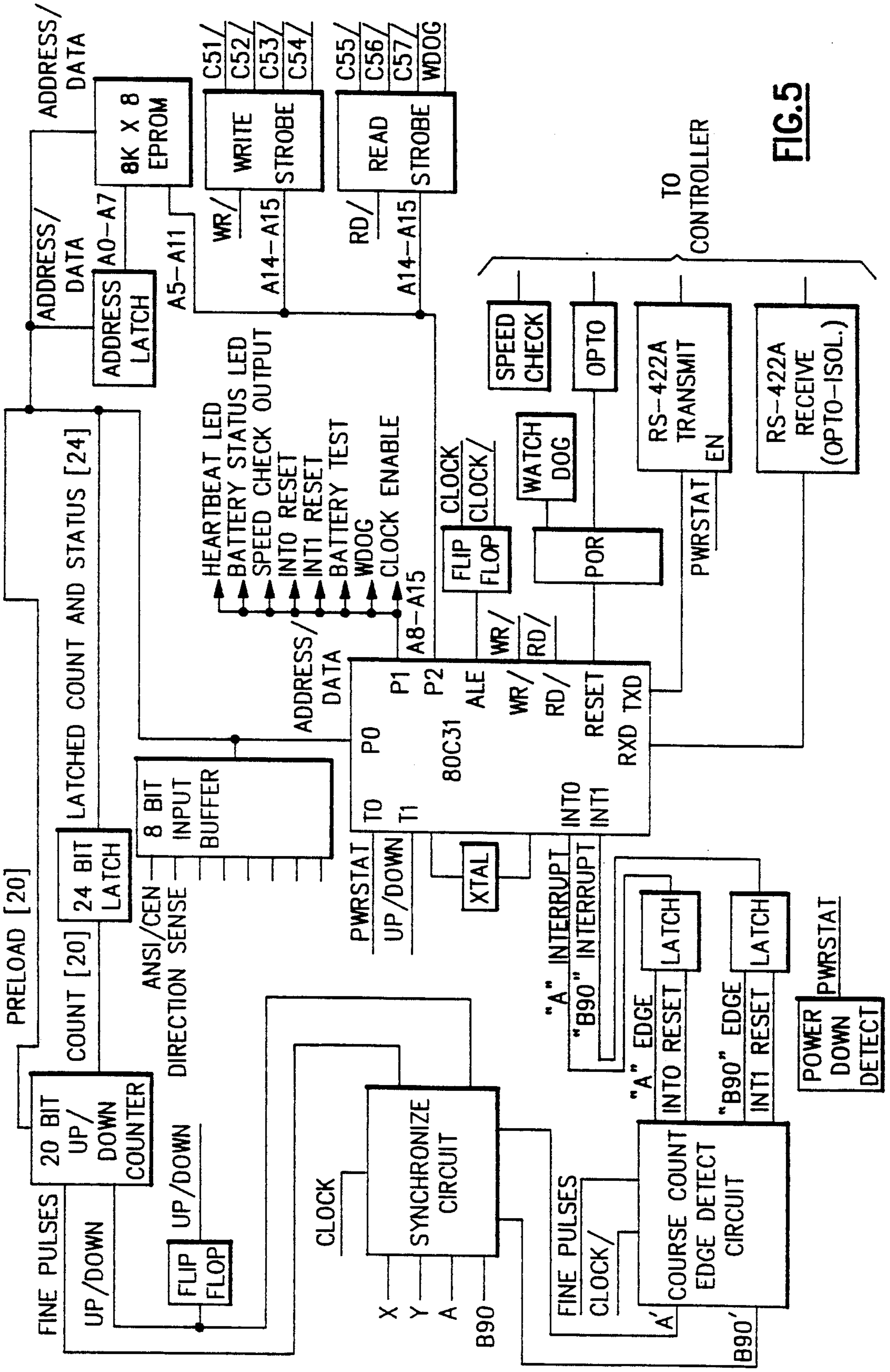
FIG. 5 is a functional block diagram of the "smart" primary position transducer circuit board assembly (SPPT CBA) of the exemplary embodiment of the present invention, showing the interfacing of its various elements through the Address/Data buses and I/O ports.

FIG. 5 shows the functional blocks of the SPPT CBA, showing the interfacing of its various elements through the Address/Data buses and I/O ports. The exemplary SPPT-CPU board includes:

- an 80C31 micro-controller;
- 128-byte internal RAM;
- synchronized encoder circuitry;
- a 20 bit pre-load up/down counter;
- 24 bit latched pre-load count and status;
- latched address/data multiplexed;
- coarse count and edge detect circuitry;
- watchdog circuitry;
- 8K×8 program memory (EPROM); and
- devices select and serial communication interfaces; all as more particularly detailed in FIG. 5. The secondary processor is similar, with the signals "J", "K", "B" and "A90" being substituted for the signals "X", "Y", "A" and "B90" of FIG. 5, respectively.

Encoders

The PPT of the exemplary embodiment can use the same mechanical connections and electrical signals of its predecessor units.

The PPT includes preferably two encoders coupled by, for example, "256:257" gearing. The encoders preferably are of identical design, and in the preferred embodiment contain two fine tracks each having - one thousand and twenty four (1024) pulses per revolution (ppr) and two - one ppr - coarse tracks.

Each pair of tracks produce signals that are in quadrature with each other. Further, the registration between the coarse and fine tracks is controlled.

The directly-driven encoder is termed the "primary encoder" and is connected directly to an appropriately toothed gear, for example, a two hundred and fifty-six (256) tooth gear. The other encoder is termed the "secondary encoder" and is connected to the primary encoder by means of a different toothed gear, for example, a two hundred and fifty-seven (257) tooth gear. The difference in the number of teeth in the gears used for the otherwise identical two transducers produces a non-1:1 ratio, namely in the preceding example, a 257/256 ratio of secondary to primary.

Exemplary signal definitions for the two encoders are outlined below

Primary Encoder:
"X"—1024 ppr fine track;
"Y"—1024 ppr fine quadrature track
"A"—1.0 ppr coarse track
"A90"—1.0 ppr coarse quadrature track.

In the case of the secondary encoder, signals "J", "K", "B" & "B90" correspond, respectively, to "X", "Y", "A" & "A90" for the primary encoder.

Each set of signals is derived from an encoder whose design preferably is identical to the other encoder. The periods of the signals coming from the secondary encoder are, in the exemplary embodiment, "257/256" times those for the primary encoder.

The main and quadrature fine track signals are processed by external circuitry, well known to those of ordinary skill in the art. This processing results in a "×4" (four times) frequency multiplication, and a determination of the direction of rotation. For each upward and downward transition on the main and quadrature tracks, an upward going transition occurs in the output of the "×4" multiplication circuitry. The performance of the position transducer is evaluated by examining the fine track signals, as processed by the multiplication circuitry.

Between the upward and downward transitions for each coarse track, there are, for example, two thousand and forty eight plus or minus one transition (2,048±1) in the associated "×4" fine track.

For clockwise rotation of the input shaft, the offset between upward transitions of signals "A" and "A90" will be one thousand and twenty four plus or minus one (1,024±1) "×4" "XY"-track counts. Similarly, the offset between upward transitions of signals "B" and "B90" will be one thousand and twenty four (1,024±1), plus or minus one (1,024±1) "×4" "JK"-track counts.

Performance is characterized by a measurement of "×4" (four times) "XY"-track counts between upward transitions of the "A" & "B90" tracks, as the input shaft is rotated clockwise (from the perspective of viewing the instrument's input shaft). For each revolution of the input shaft a new count is developed and two hundred and fifty six (256) distinct counts may be obtained. The pattern of "256" counts repeats as the input shaft is turned.

For a counter-clockwise rotation of input shaft, the "×4" "XY"-track counts preferably are between downward transitions of the "B90" and "A" tracks. This procedure assures the use of the same mechanical reference points in the instrument.

The count can go to, for example, four thousand and ninety six (4,096), which is "1000" in hexadecimal form ("HEX"). The last HEX digit is called the "remainder." The scatter of the remainder numbers determines the quality of the position transducer.

It is desirable that the remainder, as defined above, shall remain within a boundary of plus or minus two (±2). This means that all 256 test numbers must have stable remainders for all specified speeds, in both directions of rotation, independent of temperature, etc.

The remainder, as defined above, is measured for all rotations of the input shaft using the "A90" and "B" tracks instead of the "A" and "B90" tracks. The remainder thus measured is the quadrature remainder. It should meet the same requirements as the other remainder.

To connect the encoders of the "smart" transducer to the SPPT CBA two cables of, for example, the ribbon form, are used. These cables are terminated in appropriate connectors.

The main channel leads the quadrature channel for clockwise rotation of the shaft, as viewed from the shaft end of the units. This applies to (X, Y), (J, K), (A, A90) and (B, B90) and their complements.

With the input shaft rotating clockwise, the primary encoder turns clockwise, while the secondary encoder turns counter-clockwise. Thus, "X" leads "Y", "K" leads "J", "A" leads "A90" and "B90" leads "B".

Determination of Position & Velocity Info.

As noted above, in the exemplary embodiment the encoders have two sets of direct and quadrature tracks. The fine tracks produce 1024 pulses per revolution, and the coarse tracks are one ppr. When combined with times four (×4) circuitry, the effective resolution of the fine tracks is four thousand and ninety six (4,096) pulses (12 bits) per revolution. The coarse track geometry is very carefully controlled.

Figure 7:
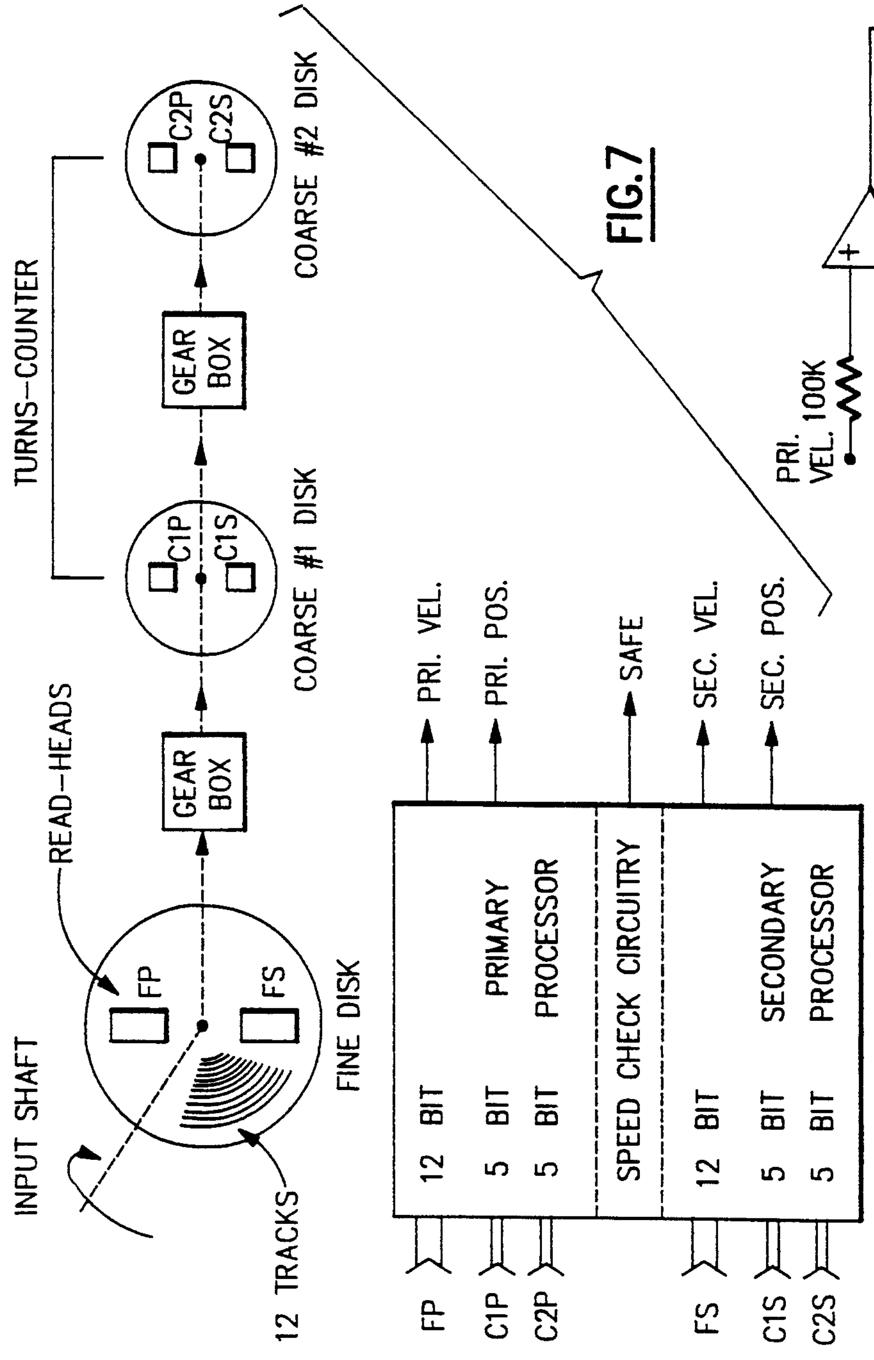
FIG. 7 is a simplified, electro-mechanical block diagram of a second embodiment SPPT using absolute encoders.

The primary encoder is directly driven, while the secondary encoder is driven through a gear system as shown in the Masel et al patent for the preferred embodiment and in FIG. 7 for a second embodiment.

In the preferred embodiment, position increments are derived from the primary fine tracks. Absolute position at "256" points (8 bit) can be established from the (spatial) phase of one coarse track on the primary encoder with respect to a coarse track on the secondary encoder. To determine coarse track phasing may require as many as two revolutions of the input shaft. The total range of the transducer is defined by "256" revolutions of the input shaft.

The absolute position readouts are characterized by (spatially derived) signals that can go to "4096" or "1000" in hexadecimal. The first part of the HEX number is coarse position (zones "0" to "255" decimal). The last digit is the remainder number. The transducer is designed so that the remainder is close to "8" HEX to permit ignoring it using a truncation (shift right) operation.

The determination of position for the primary channel requires the finding of coarse position and then adding incrementally derived fine positions to it. Further, for reasons of elevator safety, a redundant secondary position is required. This is accomplished using hardware that is independent of that used for the primary position.

Figure 4:
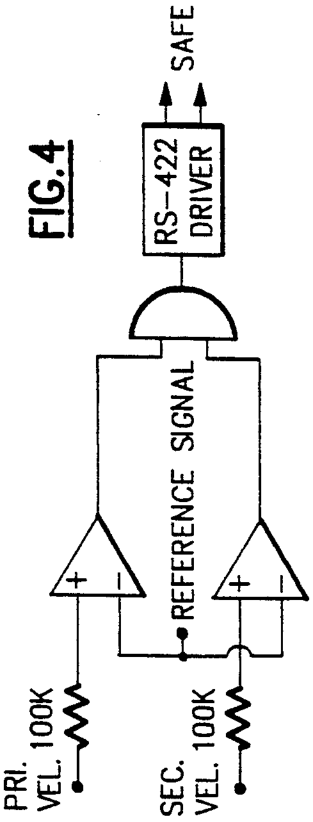
FIG. 4 is a schematic diagram providing the circuit detail for the buffered comparator shown in FIG. 6, which provides the speed check function of the present invention.
Figure 6:
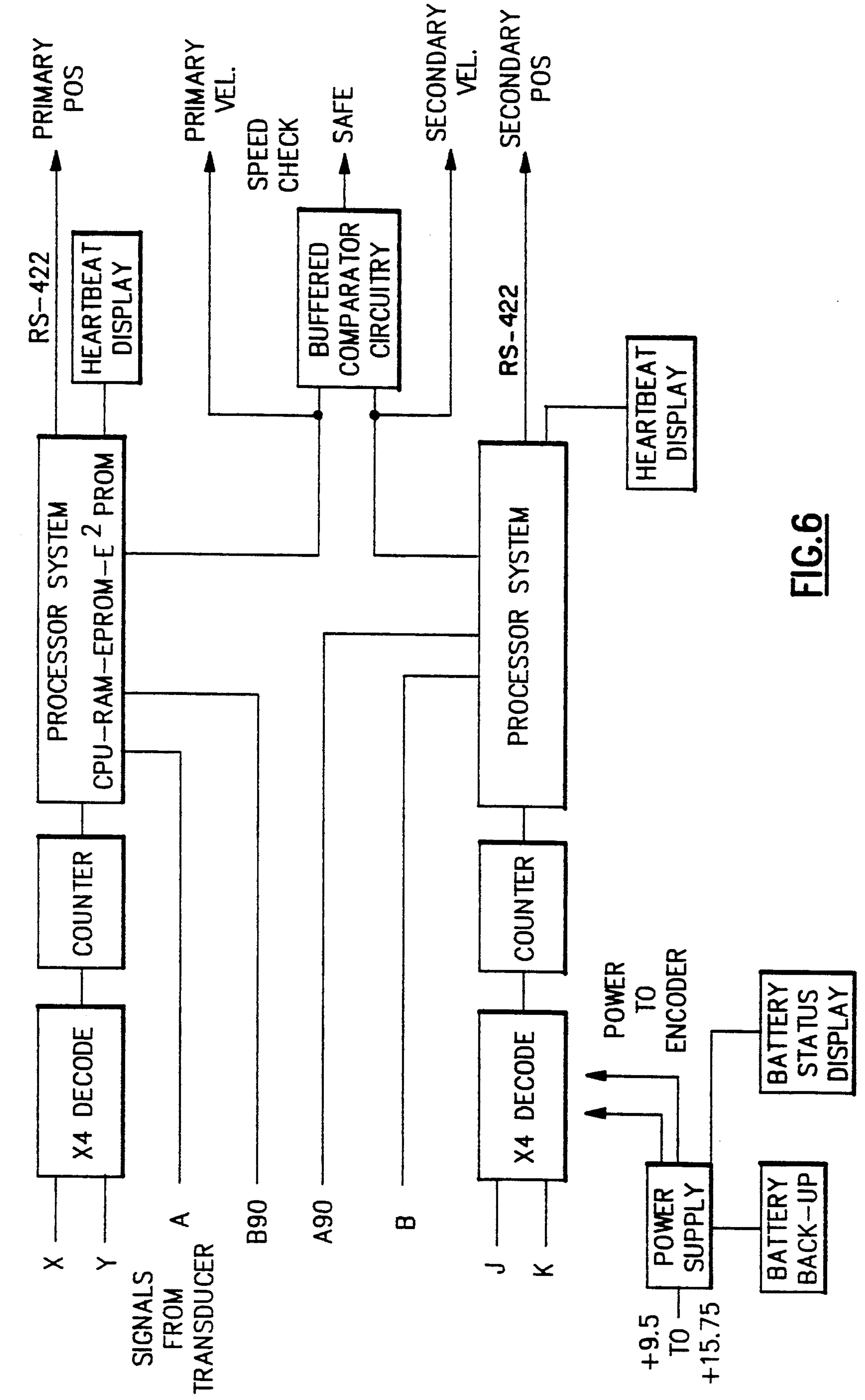
FIG. 6 is a simplified block diagram of the exemplary electronic system for the "smart" primary position transducer (SPPT) of the present invention, the circuit detail for the buffered comparator of which is shown in FIG. 4.

Described below are the procedures which can be used to find the primary and secondary position and velocity. The basic signal processing operations and power supply subsystem are shown in the block diagram of FIG. 6. Exemplary details of the speed check circuitry of FIG. 6 are shown in FIG. 4. As can be seen in FIG. 4, comparators for the primary velocity signal (PRI. VEL.) and the secondary velocity signal (SEC. VEL.) using a "REFERENCE SIGNAL" are sent to an "AND" gate, which when the signals are appropriately related sends out "SAFE" signals through an "Rs-422 DRIVER".

A second embodiment of an encoder for use in an SPPT, using absolute encoders is depicted in the electro-mechanical block diagram of FIG. 7, in which the "INPUT SHAFT" drives a twelve (12) bit absolutely encoded disk. This same "INPUT SHAFT" drives gearing that turns one or more turns-counting coarse disks through gearing. A pair of exemplary two such coarse disks, "COARSE #1 DISK" and "COARSE #2 DISK " being illustrated. Each disk has two independent read-heads, namely, "FP" & "FS" for the "FINE DISK", and "C1P" & "C1S" for "COARSE #1 DISK", and "C2P" & "C2S" for "COARSE #2 DISK," respectively, for the primary & secondary signals, respectively. The signals from the primary read-heads are input to the primary processor, while those from the secondary read-heads are input to the secondary processor, shown in FIG. 7. The primary and secondary processors are independent. These processors are connected to speed-check circuitry, which can be of the comparator type shown in FIG. 4. The encoders and electronic assemblies are typically housed in a common case.

For the preferred embodiment, using the processing of FIG. 6, the fine counts are derived from the fine tracks on each encoder. Times four "×4" multiplication is provided so that every edge of each direct and quadrature track pair is utilized. The track processing hardware and software provides either a separation of pulses resulting from opposite directions of rotation, or assignment of a sign to each pulse based on direction of rotation.

The fine track of the primary encoder is "X" and the quadrature track is "Y". The "×4" composite signal is called "XY". "4096" ("1000" HEX) XY pulses are produced per revolution of the input shaft. "256" revolutions of the input shaft produces "100000" (1,048,576) counts.

The fine track of the secondary encoder is "J" and the quadrature track is "K". The "×4" composite signal is called "JK". JK counts may be referenced to XY counts by multiplying the JK counts by "257/256=1+1/256". In HEX arithmetic this may be accomplished by adding the JK count to the JK count with the two least significant digits truncated. JK counts referenced to the primary encoder should meet the same specifications as the XY counts.

The primary and secondary coarse positions are defined by measuring the number of fine counts between transitions defined in one method by the coarse tracks. Definitions are given for a transducer having clockwise (viewing the instrument shaft) as a positive direction. The transducer should also be capable of operating with counter-clockwise defined as the positive direction. The technique for realizing a reverse-direction transducer is provided below.

The primary encoder coarse track is called "A" and the associated quadrature track is called "A90". The corresponding terminology applied to the secondary encoder is "B" and "B90".

For clockwise rotation of the input shaft, coarse primary position is found by first determining the number of "XY" counts between an upward transition of A to the immediately following upward transition of B90. This indicates the spatial "phase" between the encoders, and therefore the number of turns of the shaft. The last four (4) bits are then truncated from the XY count to obtain the coarse position. These truncated bits define the remainder number.

For counter-clockwise rotation of the input shaft, XY counts are determined from a downward transition of B90 to the next downward transition of A. The coarse position and reminder number are defined as before.

The measurement procedure assures the use of the same mechanical reference points in the transducer instrument.

Similarly, for clockwise rotation of the input shaft, coarse secondary position is found by first determining the number of Jk counts between an upward transition of A90 to the immediately following upward transition of B. The jk count is next referenced to the primary fine count by multiplying by "257/256". The truncated portion is then truncated from the derived XY count to obtain the coarse position. The truncated portion is called the quadrature remainder number.

For counter-clockwise rotation of the input shaft, JK counts are determined from a downward transition of B to the next downward transition of A90. The coarse position and quadrature remainder number are defined as before.

As above, the measurement procedure assures the use of the same mechanical reference points in the instrument.

Primary Position

Primary position as a HEX number consists of:

PRI_POS=COARSE_PRI_POS*1000+FINE_PRI_POS where FINE_PRI_POS is derived from the XY counts and equals "000" at the end of each coarse primary position determination cycle.

Two basic techniques exit for determination of primary position once the transducer system is initialized.

The first technique is to update a first primary coarse position resister based upon the fine position determined by the XY composite signal. When FINE_PRI_POS=1000, the first primary coarse position register is incremented by one count (a carry into a higher order) and a first FINE_PRI_POS register is reset to be equal to "000". More generally, FINE_PRI_POS is divided by "1000" and the result is added to COARSE_PRI_POS, and FINE_PRI_POS is reset to the remainder (local remainder, not the previously defined remainder number).

If FINE_PRI_POS goes negative, COARSE_PRI_POS should be decremented (a barron) and FINE_PRI_POS reset accordingly. On an interim basis, the fine position must always be characterized by a magnitude and sign. When the reckoning for position is complete, then fine position is always a positive number.

The second technique or method is to update a second primary coarse position register directly by measurement of the spatial "phase" as described hereinbefore. To do this FINE_PRI_POS is set equal to the appropriate value immediately after the completion of the update.

The first technique or method should always be used, while the second technique or method should be used whenever no direction reversals are used during the measurement process (that is, used at other than near floor landings).

A comparison of primary position determined by the first method is made with primary position determined by the second method. A disagreement of up to ten (10) counts (for example) may be permitted without the need to re-initialize. If the disagreement is up to five (5) counts (for example), no correction referenced to the second method is required. A disagreement in the range of five to ten (5-10) counts for two consecutive position determinations (for example) requires adjusting the method one position to agree with the method two position

Primary Velocity

The absolute primary velocity (HEX), is computed for a given cycle (N) from the PRIMARY POSITION value of the two preceding cycles. Thus:

$$\text{ABS\_PRI\_VEL(N)} = [\text{PRI\_POS}(N-1) - \text{PRI\_POS}(N-2)/1000]*(60/T)_{HEX}$$

where N is the present cycle, N−1 is the previous cycle, etc., T=cycle time, which is measured in decimal seconds.

For T=10 ms, (60/T) is HEX number "1770". The above expression should be scaled to a "0.25" rpm/count by multiplying by four (4). To get the PRI_VEL from the absolute value when the velocity is negative, "800" HEX should be added to the ABS_PRI_VEL.

For example, at "−511.75" rpm the PRI_VEL=7FF HEX. It is FFF HEX at "−511.75" rpm.

The PRI_VEL should be subjected to a running average over a period of, for example, seventy to ninety milliseconds (70 90 ms) prior to transmission.

The above computation should be first or very close to first in a cycle to assure accuracy. It should be noted that the velocity is determined using position data from two previous cycles.

Secondary Position

The secondary position as a HEX number consists of:

$$\text{SEC\_POS} = (\text{COARSE\_SEC\_POS}*1000+\text{SEC\_FINE\_POS})*(101/100)_{HEX}$$

where SEC_FINE_POS is derived from JK counts, and SEC_FINE_POS=000 at the end of each coarse secondary position determination cycle.

Two basic techniques or methods exist for the determination of secondary position once the transducer system has been initialized.

The first method is to update a first secondary coarse position register based upon the fine position determined by the JK composite signal. When SEC_FINE_POS=FFO, the first secondary coarse position register is incremented by one count a carry and a first SEC_FINE_POS register is reset to "000". More generally, SEC_FINE_POS is divided by "FFO" and the result is added to COARSE_POS, and SEC_FINE_POS is reset to the remainder (local remainder, not the previously defined remainder number).

If SEC_FINE_POS goes negative, COARSE_SEC_POS should be decremented (a borrow), and SEC_FINE_POS reset accordingly. On an interim basis, fine position should always be characterized by a magnitude and sign. When the reckoning for position is complete, then the fine position is always a positive number.

The second method of determining SEC_POS is to update the coarse position directly register by measurement of the spatial "phase" difference of the two encoders from the J, K, B and A90 tracks. SEC_FINE_POS is set to be equal to an appropriate value immediately after completion of the update.

The first method should always be used. The second method should be used whenever there are no direction reversals during the measurement process.

A comparison of secondary position by methods one with that by method two, and disagreement of up to, for example, ten (10) counts may be permitted without the need to re-initialize. If the disagreement is up to five (5) counts (for example), no correction referenced to the second method is required. A disagreement in the range of five to ten (5-10) counts for two consecutive position determinations (for example) requires adjusting the method one position to agree with the method two position.

Secondary Velocity

The absolute secondary velocity (HEX) is computed from the SECONDARY POSITION. Thus:

$$ABS\_SEC\_VEL(N)=$$

$$[SEC\_POS(N-1)-SEC\_POS(N-2)]*(1/1000)*(60/T)_{HEX}$$

where T=cycle time, which is measured in decimal seconds.

For T=10 ms, (60/T) is HEX number "1770". The above expression should be scaled to a "0.25" rpm/count by multiplying by four (4). To get the SEC_VEL from absolute value when the velocity is negative, "800" HEX should be added to the ABS_SEC_VEL.

For example, at "511.75" rpm the SEC_VEL=7FF HEX. It is FFF HEX at "-511.75" rpm.

The SEC_VEL should be subjected to a running average over a period of, for example, seventy to ninety (70-90 ms) milliseconds prior to transmission.

Initialization

Initialization is the determination of the coarse position after the first power up or after a request to reset the processor system. Primary and secondary position and battery condition are transmitted according to the protocol desired. If the coarse position is unknown, then the transducer signals this by transmitting the position as "00000H". The elevator should respond by slowly moving down unless it is determined to be too close (less than, for example, four meters) to the lowest landing.

It is highly desirable that the system include a speed check. Such a speed check should become active within, for example, one hundred (100 ms) milliseconds of power application. Unless the speed check signal is high (safe), initialization should not be allowed to start.

The transducer should determine the primary and secondary positions according to the indicated second methods above. Once accomplished, the transducer will be prepared within, for example, one processor cycle to transmit both the primary and secondary positions to the elevator system. The elevator system will continue to run a short distance even if both positions are not established. It will expect that both position signals will be established within, for example, a half meter (0.5 m; ¼ revolution, nominal) of each other. The half meter distance should be established by the elevator system using both the acquired position signal and the permitted running time.

Failure to initialize will cause the elevator system to stop and also send a reset signal to the transducer. Initialization will then be attempted one or more times before the elevator enters the "rescue" mode and finally is closed down for service.

An exemplary battery backup system should retain all stored information for, for example, an hour after any loss of main power. Within that time period, re-initialization typically should not be necessary.

Polarity Reversal

Polarity reversal is necessary as a practical matter to meet different transducer mounting situations. This may be accomplished by the following algorithms expressed in HEX (2's complement):

$$PRI\_POS=100000-PRI\_POS$$

$$SEC\_POS=100000-SEC\_POS$$

The primary velocity and the secondary velocity given above in the calculation subsection must be reversed when a polarity reversal is indicated. This can be done by changing the sign bit.

Independence, Adjustments & Safeguards

In the "real world," adjustments to the data are required because of, for example, imperfections in encoders and the basic characteristics of the transducer system.

For example, two (2) counts should be added to the un-truncated, primary, coarse position, so that on average the remainder number preferably is, for example, "8". A similar procedure should be followed for the secondary coarse position two (2) counts should be subtracted from the un-truncated, coarse, secondary position.

Additionally, the secondary position should be made to register with the primary position within, for example, five (5) counts.

In data transmission the secondary position signal may be truncated to the most significant sixteen (16) bits of data prior to transmission.

Vibratory motion of the transducer input shaft about a reference point could lead to errors, especially in the determination of coarse position. Thus, all coarse position measurements based on the second method above should be carried out in their entirety only when the motion of the elevator car is in one direction. The first method above may be used for all speeds.

In order to assure independence and the integrity of the primary position information, the signals A and B90 should be monitored every process cycle. The integrity of these signals should be established by checking the "on" and "off" periods in terms of the XY counts. The period for A should be, for example, "2048±35" counts, while the period for B90 should be "2056±35" counts.

Likewise, in order to assure the independence and integrity of the secondary position information, the signals A90 and B should be monitored every process cycle. The integrity of these signals should be established by checking the "on" and "off" periods in terms of the JK counts. The period for A90 should be, for example, "2040±35" counts, while the period for B should be "2048±35" counts.

Upon detection of any fault in a processing channel, the "not initialized" signal should be transmitted on that channel. Simultaneously, recovery action should commence.

Although this invention has been shown and described with respect to detailed, exemplary embodiments thereof, it should be understood by those skilled in the art that various changes in form, detail, methodology and/or approach may be made without departing from the spirit and scope of this invention.

We claim:

1. A speed checking system for an elevator in which the vertical position of the elevator car is translated to the shaft of an angular position encoder to rotate said encoder through a full revolution thereof many times across the range of permissible vertical positions of the elevator car within its hoistway, comprising with said shaft:

a pair of encoder disks coupled to said shaft for rotation in response thereto and having coarse indicia and fine indicia thereon which together are capable of demarcating the angular position of said encoder and the number of revolutions said encoder has rotated with respect to a reference; first and second pairs of sensing means, each disposed with respect to the indicia on said disks to provide signals which together indicate the angular position of said encoder and the number of revolutions said encoder has rotated with respect to a reference;

wherein the improvement comprises:

a first signal processing means related to said first sensing means, for providing, in a series of processing cycles, signal manifestations of successive positions of said elevator in response to indications of said indicia provided thereto by said first sensing means, for providing, in response to the respective signal manifestations in a plurality of cycles, a first elevator speed signal for a subsequent cycle;

a second signal processing means related to said second sensing means, for providing, in a series of processing cycles, signal manifestations of successive positions of said elevator in response to indications of said indicia provided thereto by said second sensing means, for providing, in response to the respective signal manifestations in a plurality of cycles, a second elevator speed signal for a subsequent cycle;

means for providing a maximum speed signal indicative of a predetermined speed which said elevator is not to exceed; and means responsive to said first and second elevator speed signals and to said maximum speed signal for providing a safe signal indicative of safe elevator operation only when said first elevator speed signal and said second elevator speed signal both indicate a speed less than the speed indicated by said maximum speed signal.

2. The speed checking system according to claim 1 wherein:

each of said disks have indicia absolutely indicative of the absolute angular position thereof with respect to a reference, and one of said disks is coupled to said shaft so that it is rotated once for each rotation of said shaft and the other of said disks is rotated once for a large number of revolutions of said shaft related to said range of permissible positions, and each pair of said sensing means has one sensing means on each of said disks.

3. The speed checking system according to claim 1 wherein:

a first one of said disks has fine indicia thereon and one of said pairs of sensing means is related thereto in a manner to provide a pair of signals in quadrature with each other for each of a large number of angular positions of said shaft, and has an indicium related to one of the other pair of sensing means for providing one coarse signal for each revolution of said shaft;

the second one of said disks is coupled to said shaft in a manner to rotate one less time than said first disk as said first disk rotates a second number of times on the order of said large number across the range of permissible elevator positions, said second disk having a coarse indicium thereon related to the other of said pairs of sensing means for providing a second coarse signal in quadrature with said one coarse signal for each revolution of said shaft;

a first one of said pair of signal processing means provides first ones of said signal manifestations as the sum of (1) coarse positions indicated by the number of said fine indicia sensed between the provision of one of said coarse signals and the provision of the other of said coarse signals in each revolution of said shaft, with (2) fine positions indicated by the accumulation within each revolution of said shaft of the number of said fine indicia sensed in such revolution of said shaft; and a second one of said pair of signal processing means provides second ones of said signal manifestations as the summation of said fine signals as said elevator travels within said range of permissible positions.

4. A position sensing system for an elevator in which the vertical position of the elevator car is translated to the shaft of an angular position encoder to rotate said encoder through a full revolution thereof many times across the range of permissible vertical positions of the elevator car within its hoistway, comprising with said shaft:

a first encoder disk having one coarse indicium and a large number of fine indicia thereon;

a pair of fine sensing means oriented with respect to said fine indicia to provide, for each revolution of said shaft, a series of pairs of fine signals in quadrature relation to each other;

a pair of coarse sensing means, one being responsive to said coarse indicium to provide one coarse signal;

a second disk disposed to said shaft in a manner to rotate one more time than said first disk as said first disk rotates a second number of times on the order of said large number across the range of permissible elevator positions, said second disk having a coarse indicium thereon related to the other of said coarse pair of sensing means for providing a second coarse signal in quadrature with said one coarse signal for each revolution of said shaft;

a first signal processing means responsive to said fine signals and to said coarse signals for providing a first elevator position signal as the summation of (1) coarse positions indicated by the number of said fine indicia sensed between provision of one of said coarse signals and the provision of the other of said coarse signals in each revolution of said shaft, with (2) fine positions indicated by the accumulation within each revolution of said shaft of the number of said fine indicia sensed in such revolution of said shaft;

a second signal processing means responsive to said fine signals for providing a second elevator position signal as the summation of said fine signals as said elevator travels within said range of permissible elevator positions; and means for comparing said first elevator position signal with said second elevator position signal and for providing a fault signal indicating fault in the event the positions indicated by said first and second elevator signals differ by more than a predetermined magnitude.

5. A position sensing system for an elevator in which the vertical position of the elevator car is translated to the shaft of an angular position encoder to rotate said encoder through a full revolution thereof many times across the range of permissible vertical positions of the elevator car within its hoistway, comprising with said shaft;

a first encoder disk disposed for rotation with said shaft and having one coarse indicium and a large number of fine indicia thereon;

a pair of fine sensing means oriented with respect to said fine indicia to provide for each revolution of said shaft a series of pairs of fine signals in quadrature relation to each other;

a pair of coarse sensing means, one being responsive to said coarse indicium to provide one coarse signal;

a second encoder disk disposed for rotation with said shaft in a manner to rotate one less time than said first disk as said first disk rotates second number of times on the order of said large number across the range of permissible elevator positions, said second disk having a coarse indicium thereon related to the other of said coarse pair of sensing means for providing a second coarse signal in quadrature with said one coarse signal for each revolution of said shaft;

processing means responsive to said fine signals and to said coarse signals for providing an elevator position signal as the summation of (1) coarse positions indicated by the number of said fine indicia sensed between provision of one of said coarse signals and the provision of the other of said coarse signals in each revolution of said shaft, with (2) fine positions indicated by the accumulation within each revolution of said shaft of the number of said fine indicia sensed in such revolution of said shaft;

means providing a first check signal indicative of the number of said fine signals which should be normally provided during the sensing of said first coarse indicium;

means providing a second check signal indicative of the number of said fine signals which should be normally provided during the sensing of said second coarse indicium;

means responsive to said fine signals and to said coarse signals for counting the number of fine signals which appear during each of said coarse signals and providing corresponding first and second count signals indicative thereof; and means responsive to said first and second check signals and to said first and second count signals for comparing said first check signal with said first count signal, for providing a fault signal in the event that said first count signal indicates a count which differs from the count indicated by said first check signal by more than a first predetermined magnitude, for comparing said second check signal with said second count signal, and for providing said fault signal in the event that said second count signal indicates a count which differs from the count indicated by said second check signal by more than a second predetermined magnitude.

6. A transducer checking system for an elevator in which the vertical position of the elevator car is translated to the shaft of an angular position encoder to rotate said encoder through a full revolution thereof many times across the range of permissible vertical positions of the elevator car within its hoistway, comprising with said shaft:

a pair of encoder disks coupled to said shaft for rotation in response thereto and having coarse indicia and fine indicia thereon which together are capable of demarcating the angular position of said encoder and the number of revolutions said encoder has rotated with respect to a reference;

first and second pairs of sensing means, each disposed with respect to the indicia on said disks to provide signals which together indicate the angular position of said encoder and the number of revolutions said encoder has rotated with respect to a reference;

a pair of signal processing means, each related to a corresponding one of said pairs of sensing means, each for providing, in a series of processing cycles, signal manifestations of successive positions of said elevator in response to indications of said indicia provided thereto by the related one of said sensing means; and means for comparing the number of said fine indicia sensed within the duration of each one of said coarse indicia and providing a fault signal in the event that any said number of said fine indicia differs from a corresponding predetermined number by a related, corresponding threshold magnitude.

* * * * *